US006973994B2

(12) United States Patent
Mackin et al.

(10) Patent No.: US 6,973,994 B2
(45) Date of Patent: Dec. 13, 2005

(54) APPARATUS FOR INCREASING THE QUALITY OF SOUND FROM AN ACOUSTIC SOURCE

(76) Inventors: Ian J. Mackin, 301 Hillcrest Dr., Belmont, NC (US) 28012; William L. Weir, 9319 Wedgewood Dr. Extension, Huntersville, NC (US) 28078

( * ) Notice: Subject to any disclaimer, the term of this patent is extended or adjusted under 35 U.S.C. 154(b) by 404 days.

(21) Appl. No.: 10/287,273

(22) Filed: Nov. 4, 2002

(65) Prior Publication Data

US 2004/0084245 A1 May 6, 2004

(51) Int. Cl.[7] .................................................. H05K 5/00

(52) U.S. Cl. ....................... 181/156; 181/145; 181/148; 181/153; 181/193; 181/196; 381/150; 381/337; 381/338; 381/341; 381/351; D14/204; D14/216; D14/221

(58) Field of Search ................................. 181/159, 279, 181/280, 177, 160, 144–157, 192–199, 179, 240; 381/350, 154, 345–347, 342, 158–160, 338–341, 349

(56) References Cited

U.S. PATENT DOCUMENTS

| | | | | | |
|---|---|---|---|---|---|
| 3,687,221 | A | | 8/1972 | Bonnard | |
| 3,768,260 | A | * | 10/1973 | Glenn | 60/323 |
| 3,917,024 | A | | 11/1975 | Kaiser, Jr. | |
| 4,106,287 | A | * | 8/1978 | Auclair et al. | 60/274 |
| 4,168,761 | A | * | 9/1979 | Pappanikolaou | 181/156 |
| 4,689,609 | A | | 8/1987 | Ko et al. | |
| 4,702,893 | A | * | 10/1987 | Kirk et al. | 422/173 |
| 5,187,333 | A | | 2/1993 | Adair | |
| 5,373,564 | A | | 12/1994 | Spear et al. | |
| 5,406,637 | A | * | 4/1995 | Gonzalez | 381/338 |
| 5,432,860 | A | | 7/1995 | Kasajima et al. | |
| 5,721,786 | A | | 2/1998 | Carrington | |
| 5,751,827 | A | | 5/1998 | Takahashi | |
| 5,824,969 | A | * | 10/1998 | Takenaka | 181/156 |
| 6,062,339 | A | * | 5/2000 | Hathaway | 181/156 |
| 6,078,676 | A | * | 6/2000 | Takenaka | 381/338 |
| 6,275,597 | B1 | * | 8/2001 | Roozen et al. | 381/345 |
| 6,356,643 | B2 | | 3/2002 | Yamagishi et al. | |
| 2001/0012372 | A1 | | 8/2001 | Yamagishi et al. | |

FOREIGN PATENT DOCUMENTS

| | | | |
|---|---|---|---|
| JP | 06178375 | A | 6/1994 |

* cited by examiner

*Primary Examiner*—David Martin
*Assistant Examiner*—Renata McCloud
(74) *Attorney, Agent, or Firm*—Summa & Allan, P.A.

(57) ABSTRACT

An apparatus for increasing the quality of sound from an acoustic source comprises in one embodiment a hollow enclosure, an acoustic source, an acoustic guide, a pair of acoustic inlet openings, a pair of acoustic exit openings, and pair of acoustic paths, wherein the acoustic inlet openings separate acoustic waves from the acoustic source and direct the acoustic waves the length of the acoustic paths to the acoustic exit openings in such a manner as to increase the quality of sound, and especially bass sound, from the acoustic source.

46 Claims, 2 Drawing Sheets

Fig. 1.
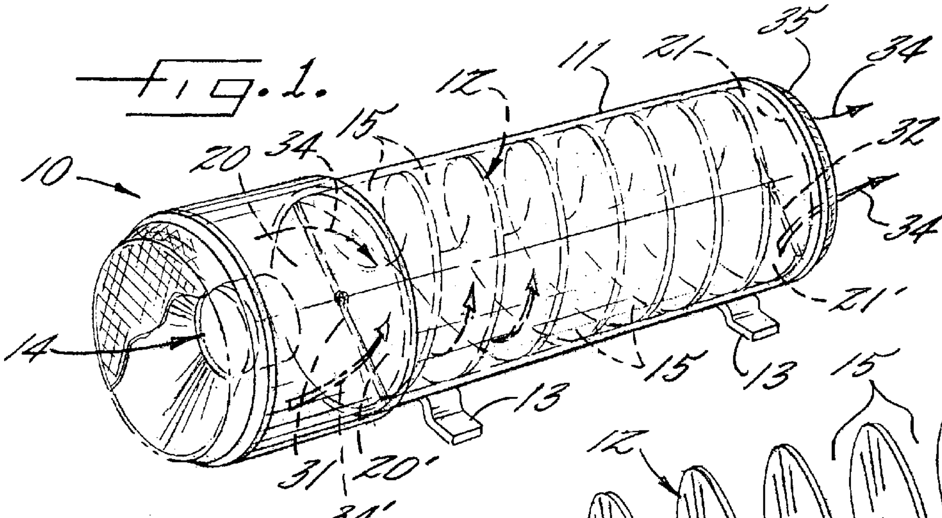
Fig. 2.
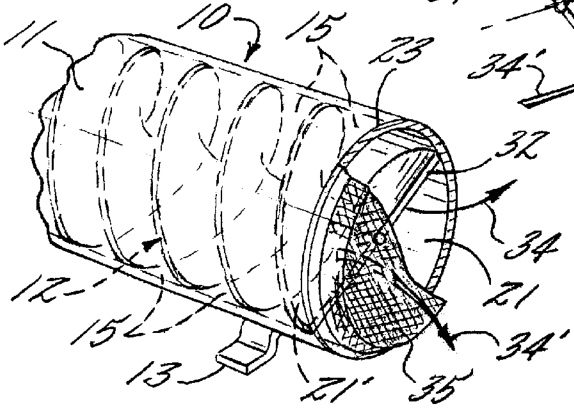
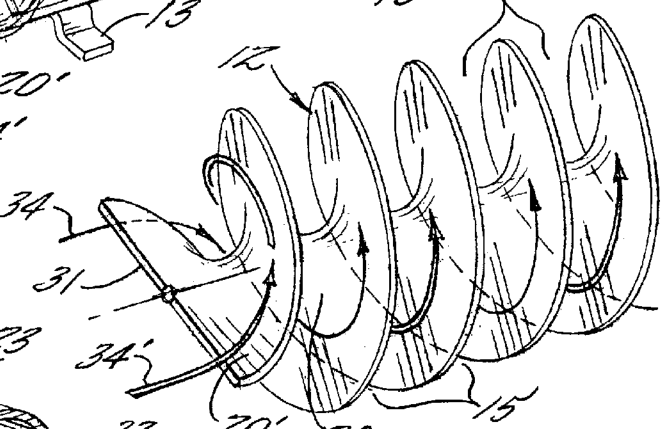
Fig. 3.
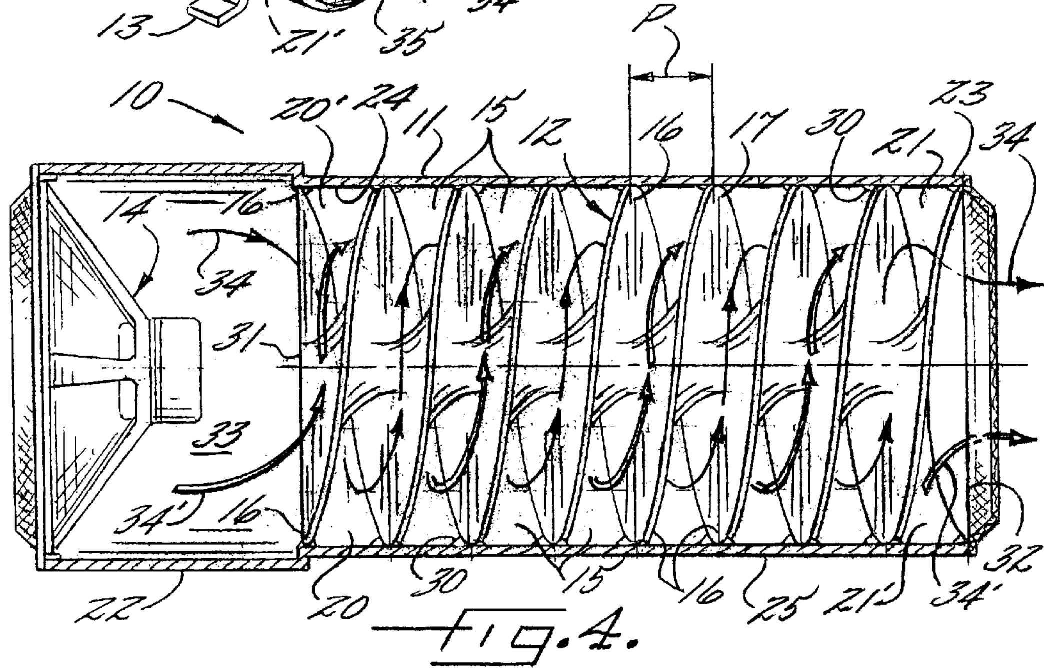
Fig. 4.

APPARATUS FOR INCREASING THE QUALITY OF SOUND FROM AN ACOUSTIC SOURCE

FIELD OF THE INVENTION

The invention relates to an enclosure for an acoustic source. In particular, the invention relates to an apparatus for increasing the quality of sound from an acoustic source, and that is particularly suited for improving acoustic output of bass sounds.

BACKGROUND OF THE INVENTION

Acoustics technology, and in particular stereo technology, has advanced to meet the demand for improved sound quality. The rising popularity in home theater systems and related sound technologies has refocused the stereo industry towards improved and more efficient sound systems. Sound systems are also an integral part of vehicles of all types. Advances in acoustics and electronics technology have resulted in smaller and more efficient delivery systems. Nevertheless, acoustic principles demand relatively lengthy transmission lines or acoustic paths. For example, known acoustic paths may extend up to several feet. Space restrictions in houses, vehicles, and mobile stereos, however, limit the use of such acoustic paths and the relatively large enclosures that house them.

Production of sound within an enclosure, whereby acoustic waves are directed along an acoustic path, is a critical aspect of the process. Specifically, sound is produced by an acoustic source, for example, a driver, and then directed along an acoustic path to an opening. The shape of the acoustic path affects the quality of sound exiting the outlet.

Existing apparatus address the problem of improving sound quality while minimizing space requirements by incorporating acoustic paths having sharp bends (i.e., folded paths) such that the acoustic path fits within the enclosure. The folded or labyrinth designs for acoustic paths require sharp bends that disrupt airflow, and thus degrade sound quality and increase mechanical noise. Further, known devices incorporate relatively long acoustic paths that are unsuitable for use in close quarters (e.g., apartments and car stereos).

Known apparatus also address the problem of minimizing space requirements by incorporating helical acoustic paths, wherein structures housed within the enclosure define a single helix acoustic path. The single helix design, however, fails to recognize the benefits of a double helix structure. Specifically, the single helix design limits the air mass (i.e., acoustic mass) that provides the medium for transmitting the acoustic waves.

For example, U.S. Pat. No. 5,824,969 (the '969 patent) and U.S. Pat. No. 6,078,676 (the '676 patent) to Takenaka disclose a speaker system having a single spiral sound passage. Both Takenaka patents disclose a lower T-joint for supporting an outer tube, an inner tube for supporting a partition plate arranged in a spiral pattern, an upper T-joint connected to the top end of the outer tube, and a speaker unit secured to the upper T-joint. As described, the Takenaka patents rely on a single passage for directing sound radiating from the rear of the speaker. Specifically, the Takenaka patents incorporate a single inlet opening leading into a single passage that is in communication with a single outlet opening. Although both patents address the problem of sharp or acute bends in the sound passage, the '969 and '676 patents fail to recognize the advantages of incorporating two sound passages in the shape of a double helix. Further, the Takenaka patents describe the use of a dual tube structure wherein the inner tube supports the partition plate. Thus, Takenaka further restricts the limited area of the single sound passage—and thus total medium (i.e., air) for transmitting sound—by incorporating a support structure for the spiral plate. Thus there exists a need for an apparatus that maximizes the total area of the sound passage without adversely affecting the overall size of the enclosure housing the acoustic source and acoustic guide.

Still other known apparatus incorporate double helix channels into an enclosure, yet position the channels around the periphery of the driver and around an inner sleeve that supports the driver at a front end. In this configuration, inlets for directing sound into the channels are adjacent the rear end of the inner sleeve and outlets of the passage are adjacent the front of the driver. This design, wherein the radius of the acoustic channel is a fraction of the total radius of the enclosure or inner sleeve, recognizes the need to maximize space, yet sacrifices sound quality by directing the sound from the driver in opposing directions (i.e., front to rear and then rear to front). The relatively small channels tend to create mechanical resonance, increase harmonic distortion, and restrict low frequency reproduction.

For example, U.S. Pat. No. 6,062,339 to Hathaway describes an enclosure for housing a loudspeaker. Specifically, Hathaway discloses an outer sleeve that supports and surrounds an inner sleeve, a loudspeaker connected to a front end of the inner sleeve, and an insert positioned between the outer sleeve and inner sleeve. The insert defines two spiral channels that surround the inner sleeve. The channels direct sound advancing from the rear of the front-mounted speaker, around the inner sleeve (i.e., between the inner and outer sleeve), and out of the front of the enclosure. Hathaway relies upon two spiral channels that wind around the outer surface of the inner sleeve that supports the loudspeaker. Thus, the sound must travel in opposing directions before exiting the enclosure. Specifically, the sound must travel rearward the length of the inner sleeve, and then forward through the channels between the inner and outer sleeve. Thus, Hathaway fails to recognize the benefits of a pair of acoustic paths having the shape of a double helix that effectively doubles the volume of air (i.e., medium) for transmitting the sound. Stated differently, Hathaway recognizes the need to maximize space by wrapping the channels around the inner sleeve, yet sacrifices sound quality by directing the sound from the driver in opposing directions (i.e., front to rear and then rear to front). Accordingly, Hathaway fails to address the problem of maximizing the radius—and thus the total area—of the channels. Unfortunately, the structure of Hathaway creates mechanical resonance, increase harmonic distortion, and restrict low frequency reproduction.

Accordingly, there exists a need for an apparatus for improving the quality of sound from an acoustic source housed within an enclosure that directs sound in one direction in such a manner to dampen mechanical resonance, reduces harmonic distortion, and extends low frequency reproduction.

Known devices also include six or more resonant antinodes along the acoustic path that cause impedance variations at specific frequencies, and therefore creates uneven amplitude response. One option to counteract the uneven amplitude response is to incorporate damping material into the inlets of the acoustic paths. However, the addition of damping material into the inlets reduces the efficiency of the system, and therefore is a less desirable option. Moreover, the amount of damping material is dictated by the amount of available free space in the enclosure and acoustic path. Thus, a need exists for an enclosure and acoustic guide that does not require damping material to lessen uneven amplitude response.

A more attractive option in addressing the failures above is to increase the total area of the acoustic path without increasing the total size of the enclosure and without enhancing mechanical resonance, increasing harmonic distortion, or restricting low frequency reproduction. In this fashion, sound quality of the apparatus is not sacrificed for smaller sizes.

OBJECT AND SUMMARY OF THE INVENTION

It is therefore an object of the present invention to provide an apparatus capable maximizing the total area of a sound passage with an enclosure, without adversely affecting the overall size of the enclosure housing the acoustic source and acoustic guide.

Another object of the invention is to provide an apparatus for improving the quality of sound from an acoustic source housed within an enclosure that directs sound in one direction in such a manner to dampen mechanical resonance, reduce harmonic distortion, and extend low frequency reproduction.

Yet another object of the invention is the provision of an enclosure housing an acoustic guide that does not require damping material to lessen uneven amplitude response.

The invention meets these objectives with an apparatus capable of directing acoustic waves from an acoustic source housed within an enclosure that dampens mechanical resonance, reduces harmonic distortion, and extends low frequency reproduction of sound. These objectives are accomplished by maximizing the total area of the acoustic paths without increasing the space required to operate the apparatus. In particular, the invention is an apparatus comprised of a hollow enclosure that substantially surrounds an acoustic guide, an acoustic source secured to one end of the hollow enclosure, a pair of paths in the shape of a double helix defined by the acoustic guide, and a pair of acoustic inlet openings and a pair of acoustic exit openings in communication with the acoustic paths.

The foregoing and other objects and advantages of the invention and the manner in which the same are accomplished will become clearer based on the following detailed description taken in conjunction with the accompanying drawings in which:

BRIEF DESCRIPTION OF THE DRAWINGS

FIG. 1 is a perspective view of a preferred embodiment of the apparatus as incorporated into a floor unit for a home stereo system that depicts a hollow enclosure, an acoustic source, an acoustic guide, a pair of acoustic inlet openings, a pair of acoustic paths, a driver, a support leg, and acoustic waves flowing from the driver and into the pair of acoustic paths.

FIG. 2 is a partial perspective view of the preferred embodiment of the invention that depicts a second end of the hollow enclosure, a pair of acoustic exit openings, webbing for preventing debris from entering the acoustic exit openings, and the acoustic waves flowing out of the pair of acoustic exit openings.

FIG. 3 is a partial perspective view of the preferred embodiment of the invention depicting the double helix shape of the acoustic guide, the double helix shape of the pair of acoustic paths, and the acoustic waves flowing into the acoustic inlet openings.

FIG. 4 is a side view of the preferred embodiment of the invention illustrating the hollow enclosure, the acoustic source and its spaced relationship to the acoustic guide, the empty chamber, the acoustic guide and its pitch, the pair of acoustic paths, the positional relationship of the acoustic inlet openings substantially perpendicular to the acoustic waves, and the acoustic waves entering the acoustic inlet openings, traveling along the acoustic path, and exiting the pair of acoustic exit openings.

DETAILED DESCRIPTION OF THE INVENTION

Figure 5:
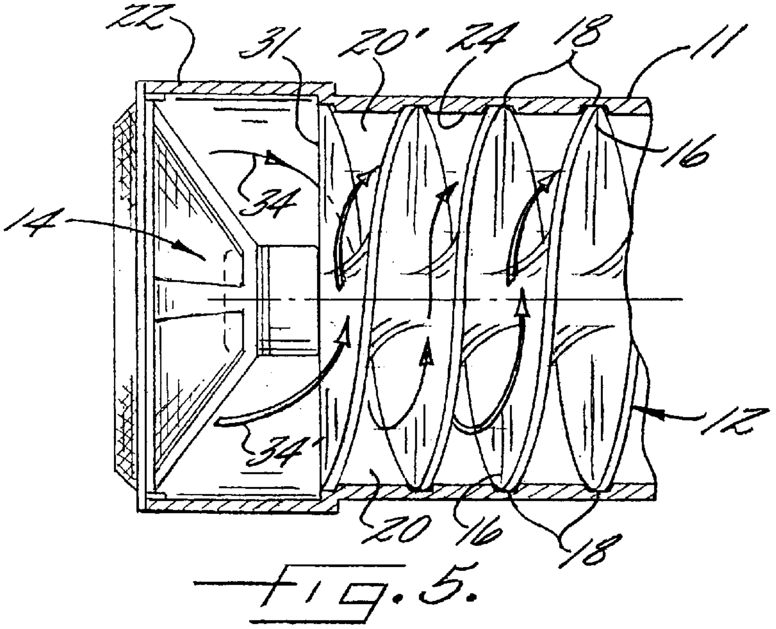
FIG. 5 is an enlarged partial side sectional view of an alternative embodiment of the invention depicting the acoustic source connected to the first end of the acoustic guide and the acoustic guide mounted in grooves formed in the hollow enclosure.

The present invention will now be described more fully hereinafter with reference to the accompanying drawings, in which a preferred embodiment of the invention is shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The term "wave", and in particular "acoustic wave", will refer to a disturbance traveling through a medium, for example, a sound wave traveling through an air mass. Hence, the terms wave, acoustic wave, and sound wave may be used interchangeably.

It will be understood that as used herein the term the term "acoustic path" refers to a passage that directs acoustic waves.

The term "damping" as used herein refers to the reduction of movement of a speaker cone due to the electromechanical characteristic of the speaker driver and suspension, the effect of frictional losses inside a speaker enclosure, or electrical means.

Those skilled in the art will appreciate that the term "pitch" refers to the distance from any point on a side edge of the double helix-shaped acoustic guide to the corresponding point on an adjacent edge measured parallel to the longitudinal axis of the guide. Stated differently in terms of a screw, the pitch is the distance from any point of a thread of the screw to the corresponding point on an adjacent thread measured parallel to the longitudinal axis of the screw.

The term "oblique" refers to the positional relationship of one element to another element whereby one element is neither parallel nor perpendicular to the other element.

It will be further understood by those skilled in the art that the term "double helix" refers to the structural arrangement of the acoustic guide that consists of two continuous surfaces that extend outwardly at an oblique angle from the longitudinal axis of the acoustic guide.

It will also be appreciated that the term "circumference" refers to the boundary line of a structure.

Further, the term "radius" refers to the distance of a straight-line segment that joins the center of a circular or spiral structure (e.g., double helix structure) with any point on its circumference.

It will also be understood that the term "acoustic source" refers to any number of devices capable of producing noise or acoustic waves (e.g., a stereo driver, a speaker, or resonator).

It will be further appreciated by those of ordinary skill in the art that, as used herein, the concept of an element "substantially surrounding" another element does not necessarily imply that the elements are contiguous (i.e., in intimate contact). Rather, as used herein, the concept of one element substantially surrounding another element is meant to describe the relative positions of the elements within the structure, respectively.

It will be further appreciated by those of ordinary skill in the art that, as used herein, the concept of an element being "between" two other elements does not necessarily imply that the three elements are contiguous (i.e., in intimate contact). Rather, as used herein, the concept of one element between two other elements is meant to describe the relative positions of the elements within the structure, respectively. Similarly, as used herein, the concept of an element being connected to a second element by a third element, "opposite" the second element, merely describes the relative positions of the first and second elements within the structure.

It will be understood to those skilled in the art that the concept of an element being "adjacent" another element does not necessarily imply that the elements are contiguous (i.e., in intimate contact). Rather, as used herein, the concept of an element being adjacent another element is meant to describe the relative positions of the elements wherein the elements are in close proximity. Furthermore, it will be understood that the concept of one element being adjacent another element does not necessarily imply contact, but may imply absence of anything of the same kind between the elements.

In addressing,the quality of sound produced by acoustic source housed within an enclosure, those skilled in the art will recognize several factors affecting resonance. In acoustic terms, the factors are as follows. The magnification of resonance factor of any resonant device or circuit is defined as Q. For example, a driver with a high Q is more resonant that a driver with a low Q. Further, it will be understood that the electrical Q of the driver is represented as Qes, the mechanical Q of the driver is represented as Qms, and the total Q is represented as Qts.

An overall view of the apparatus 10 for increasing the quality of sound from an acoustic source housed within an enclosure as incorporated in a home stereo system and which depicts features of the present invention is set forth in FIG. 1. A preferred embodiment of the apparatus 10 includes a hollow enclosure 11, an acoustic guide 12, at least one leg 13, an acoustic source 14, a pair of acoustic paths 15, a pair of acoustic inlet openings 20, 20', and a pair of acoustic exit openings 21, 21'. It will be appreciated by those skilled in the art that the present invention may be incorporated into a variety of sound systems to include vehicle stereo, portable stereos, home entertainment systems, amplifiers, and musical instruments (e.g., keyboard instruments such as pianos).

As depicted in FIG. 4, the hollow enclosure 11 substantially surrounds the acoustic guide 12. The hollow enclosure 11 includes a first end 22, a second end 23, an interior surface 24, and an exterior surface 25. As configured, edges 16 of the acoustic guide 12 abut the interior surface 24 of the hollow enclosure 11. In a preferred embodiment, the hollow enclosure 11 is substantially circular and substantially surrounds the acoustic guide 12. Alternative embodiments of the invention may include a hollow enclosure 11 that is substantially oval in shape.

The acoustic guide 12 is preferably mounted to the interior surface 24 of the hollow enclosure 11. In a preferred embodiment, the acoustic guide 12 is mounted to the interior surface 24 of the hollow enclosure 11 by adhesive 30 (see FIG. 4). It will be understood however that the acoustic guide 12 may be mounted to the interior surface 24 of the hollow enclosure 11 with foam rubber, hook-and-loop fasteners, or the like. Alternatively, the acoustic guide 12 may be mounted into grooves 18 formed in the interior surface 24 of the hollow enclosure 11 (see FIG. 5). The grooves 18 formed in the interior surface 24 of the hollow enclosure 11 correspond to the edges 16 of the acoustic guide 12. In this fashion, the acoustic guide 12 can be screwed into the hollow enclosure 11.

As configured in a preferred embodiment of the invention illustrated in FIG. 4, the acoustic guide 12 is shaped in the form of a double helix and includes a first end 31 and a second end 32. The hollow enclosure 11 and the acoustic guide 12 of FIG. 4 define a common axis. The acoustic guide 12 is preferably made from polymeric material such as polyethylene or polypropylene. It will be understood however that the acoustic guide 12 may be formed from metal, wood, synthetic resin, glass, or ceramic.

In the preferred embodiment of FIG. 4 the first and 31 of the acoustic guide 12 is spaced from the acoustic source 14. The preferred embodiment includes an empty chamber 33 defined by the interior surface 24 of the hollow enclosure 11, the first end 22 of the hollow enclosure, and the first end 31 of the acoustic guide 12. Advantageously, the empty chamber 33 provides sufficient damping of, for example, a speaker cone of the acoustic source 14. Preferably the pair of acoustic inlet openings 20, 20' are spaced less than 6 inches from a diaphragm of the acoustic source 14 assuming a medium size driver (i.e., 10 inch subwoofer). Stated differently, the pair of acoustic inlet openings 21, 21' is preferably spaced less than 2 inches from the rear of the driver. Accordingly, it is possible to construct the present invention such that the length of the hollow enclosure 11 is approximately 22 inches in length. It will be understood that the spacing will vary depending upon the size and type of subwoofer provided.

FIG. 5 depicts an alternative embodiment of the invention, wherein the first end 31 of acoustic guide 12 is connected or immediately adjacent to the acoustic source 14 in a close-coupled arrangement. This configuration minimizes the space required for the hollow enclosure 11 without sacrificing the quality of sound. The positioning of the first end 31 of the acoustic guide 12 and the acoustic source 14—wherein the first end of the acoustic guide is connected or immediately adjacent the acoustic source—minimizes the volume (i.e., box volume) of space between the acoustic source 14 and the acoustic guide 12. By minimizing box volume, the arrangement of the first end 31 of the acoustic guide 12 and the acoustic source 14 maintains the total Q ($Q_t$) of the empty chamber 33 above 1. The close-coupled arrangement, however, requires a driver with a high mechanical Q ($Q_{ms}$) (e.g., 5 or greater) relative to electrical Q ($Q_{es}$) and total Q ($Q_{ts}$)

As illustrated in FIG. 4, the radius of the acoustic guide 12 is substantially equal to the radius of the hollow enclosure 11. Advantageously, the incorporation of the double helix shape into the acoustic guide 12 maximizes the total area of the pair of acoustic paths 15. Stated differently, the acoustic paths 15 extend the entire radius of the hollow enclosure 11 to thereby provide increased air mass that serves as a transmitting medium.

The pitch P of the acoustic guide 12 facilitates tho transmission of a variety of acoustic waves 34, 34' (see FIG. 4). As described above and with reference to FIG. 4, "pitch" P refers to the distance from any point on an edge 16 of the double helix-shaped acoustic guide 12 to the corresponding point on an adjacent edge 17 measured parallel to the longitudinal axis of the acoustic guide 12. In a preferred embodiment, the pitch P of the acoustic guide 12 is between about 0.0625 to 4 inches (i.e., 0.15875 to 10.16 centimeters (cm), respectively) and more preferably between about 1 to 2 inches (i.e, 2.54 to 5.08 cm).

Referring to FIGS. 1 and 3, the first end 31 of the acoustic guide 12 defines the pair of acoustic inlet openings 20, 20'. The pair of acoustic inlet openings 20, 20' is capable of admitting acoustic waves 34, 34' produced by the acoustic source 14 into the pair of acoustic paths 15. Preferably, the acoustic source 14 is a driver, but it will be understood that the acoustic source may be any number of devices that produce acoustic waves (e.g., resonator). In a preferred embodiment, the acoustic source 14 is secured to the first end 22 of the hollow enclosure 11. With reference to the orientation of the acoustic guide 12 depicted in FIG. 4, the pair of acoustic inlet openings 20, 20' is preferably oriented substantially coplanar with respect to one another. Nevertheless, it will be understood that the pair of acoustic inlet openings 20, 20' may be oriented in a non-coplanar configuration. The orientation of the pair of acoustic inlet openings 20, 20' depends upon the type of mound (e.g., bass) upon which the operator is trying to improve.

The second end 32 of the acoustic guide 12 defines the pair of acoustic exit openings 21, 21' as illustrated in FIGS. 2 and 4. The pair of acoustic exit openings 21, 21' is in communication with the pair of acoustic inlet openings 20, 20' and the pair of acoustic paths 15. Advantageously, tho pair of acoustic inlet openings 20, 20' separate acoustic waves 34, 34' emanating from the acoustic source 14 and direct the acoustic waves 34, 34' along the pair of acoustic paths 15 to the acoustic exit openings 21, 21'. In the preferred embodiment of FIG. 4, the pair of acoustic exit openings 21, 21' is oriented substantially coplanar with respect to one another. Nevertheless, it will be understood that the pair of acoustic exit openings 21, 21' may be oriented in a non-coplanar configuration. The orientation of the pair of acoustic exit openings 21, 21' depends upon the type of sound (e.g., bass) upon which the operator is trying to improve.

Still referring to FIG. 4, the pair of acoustic exit openings 21, 21' is preferably oriented substantially coplanar with respect to the second end 23 of the hollow enclosure 11. It will be understood, however, that the pair of acoustic exit openings 21, 21' may be oriented in a non-coplanar relationship with respect to the second end 23 of the hollow enclosure 11. The orientation of the pair of acoustic exit openings 21, 21' with respect to the second end 23 of the hollow enclosure 11 depends upon the type of sound upon which the operator is trying to improve.

The pair of exit openings 21, 21' may also include webbing 35 that prevents the admission of debris into the exit openings 21, 21' (see FIGS. 1 and 2). The webbing 35 is preferably formed from foam, but may be formed from wire or textile material (i.e., woven or non-woven textile material).

As illustrated in FIG. 4 depicting a preferred embodiment, the pair of acoustic inlet openings 20, 20' and the pair of acoustic exit openings 21, 21' are oriented substantially parallel to one another. Further, as configured in the preferred embodiment, the pair of acoustic inlet openings 20, 20' and the pair of acoustic exit openings 21, 21' are oriented in a plane that is substantially perpendicular to the path of acoustic waves 34, 34' produced by the acoustic source 14 (see FIG. 4). This configuration minimizes the travel distance necessary for the acoustic waves 34, 34' to reach the pair of acoustic inlet openings 20, 20', thereby reducing the likelihood of diminished sound quality. Moreover, this design reduces the number of surfaces off of which the waves 34, 34' must reflect in order to reach the pair of acoustic inlet openings 20, 20', thereby minimizing out-of-phase reflection of the acoustic waves 34, 34'.

As shown in FIGS. 1 and 4, the acoustic source 14 is secured to the first end 22 of the hollow enclosure 11. In operation, acoustic waves 34, 34' emanate from the rear of the acoustic source 14 and travel directly into the pair of acoustic inlet openings 20, 20'.

Figure 6:
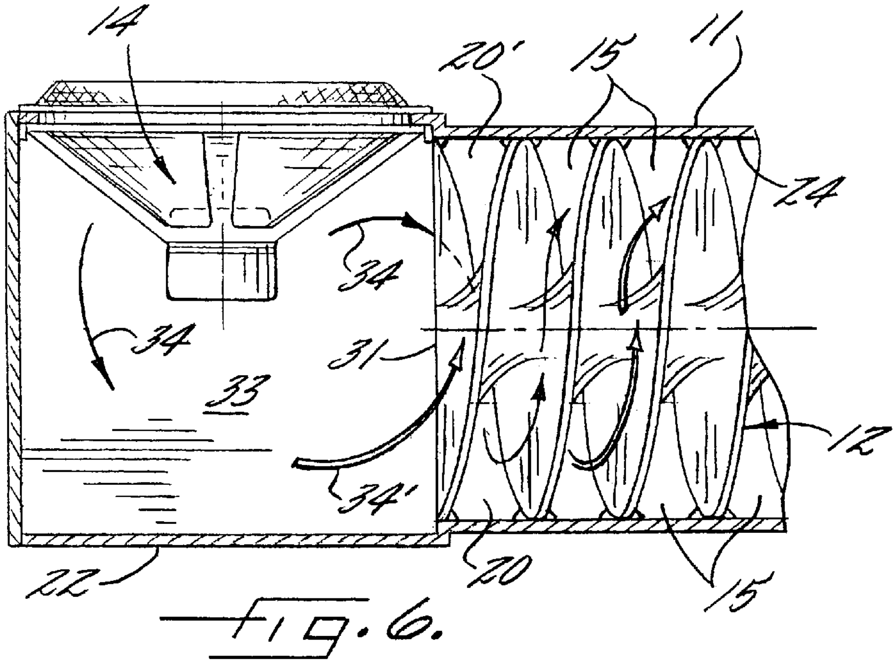
FIG. 6 is an enlarged partial side sectional view of an alternative of the invention illustrating the positional relationship of the acoustic)inlet openings substantially parallel to the acoustic waves.

In an alternative embodiment illustrated in FIG. 6, the pair of acoustic inlet openings 20, 21' and the pair of acoustic exit openings 21, 21' (see FIGS. 2 and 3) may be oriented in a plane that is substantially parallel to the path of acoustic waves 34, 34' produced by the acoustic source 14. In the alternative embodiment, the acoustic source 14 is secured to one side of the hollow enclosure 11. Accordingly, the acoustic waves 34, 34' emanate from the rear of the acoustic source 14, reflect against the sides of the first end 22 of the hollow enclosure 11, and then into the pair of acoustic inlet openings 20, 20'.

Preferably, the pair of acoustic inlet openings 20, 20' and the pair of acoustic exit openings 21, 21' are substantially semi-circular in shape. Nevertheless, it will be understood that the pair of acoustic inlet openings 20, 20' and acoustic exit openings 21, 21' may be any number of shapes to include circular, square, triangular, octagonal, elliptical, or hexagonal.

The acoustic guide 12 defines the pair of acoustic paths 15 in the shape of a double helix. The pair of acoustic paths 15 is positioned between the pair of acoustic inlet openings 20, 20' and the pair of acoustic exit openings 21, 21'. Accordingly, the pair of acoustic paths 15 directs acoustic waves 34, 34' from the pair of acoustic inlet openings 20, 20' to the pair of acoustic exit openings 21, 21'. As depicted in FIG. 4, the radius of each acoustic path 15 is substantially equal to the radius of the hollow enclosure 11. Advantageously, the acoustic paths 15 maximize the total air mass of the acoustic paths without adversely affecting the overall size of the enclosure.

The invention may also include at least one support leg 13 secured to the exterior surface 25 of the hollow enclosure 11 as illustrated in FIGS. 1 and 2. The leg 13 is preferably connected to the hollow enclosure 11 such that the leg extends substantially perpendicular to the longitudinal axis of the hollow enclosure 11 to prevent rotational movement.

That which is claimed is:

1. An apparatus for increasing the quality of sound from an acoustic source by improving the range of bass sounds produced by the acoustic source, said apparatus comprising:

an acoustic guide having a first end and a second end, said acoustic guide in the shape of a double helix;

a hollow enclosure substantially surrounding said acoustic guide, said hollow enclosure having a first open end and a second open end;

a pair of acoustic inlet openings defined by said first end of said acoustic guide, said pair of acoustic inlet openings receptive to the admission of acoustic waves; and a pair of acoustic exit openings defined by said second end of said acoustic guide, each one of said pair of acoustic exit openings in communication with each one of said pair of acoustic inlet openings, respectively;

a pair of acoustic paths defined by said acoustic guide, said pair of acoustic paths positioned intermediate of said pair of acoustic inlet openings and said pair of acoustic exit openings; and an acoustic source secured to said first open end of said enclosure, said acoustic source spaced apart longitudinally from said acoustic guide;

wherein each one of said acoustic paths is mutually exclusive of the other and promotes unidirectional travel of the acoustic waves;

wherein said pair of acoustic inlet openings separate acoustic waves emanating from the acoustic source and direct the acoustic waves to said pair of acoustic exit openings.

2. The apparatus according to claim 1, wherein the radius of said acoustic guide is substantially equal to the radius of said hollow enclosure.

3. The apparatus according to claim 1, wherein the pitch of said acoustic guide is between about 0.15 and 10 centimeters.

4. The apparatus according to claim 1, wherein the pitch of said acoustic guide is between about 2 and 5 centimeters.

5. The apparatus according to claim 1, wherein said acoustic guide is mounted to the interior surface of said hollow enclosure with material selected from the group consisting of adhesive, foam rubber, and book-and-loop fasteners.

6. The apparatus according to claim 1, wherein:

said hollow enclosure includes grooves formed in the interior surface of said hollow enclosure;

said grooves in a corresponding relationship with edges of said acoustic guide;

said acoustic guide mounted in said grooves in the interior surface of said hollow enclosure.

7. The apparatus according to claim 1, wherein said hollow enclosure is substantially circular.

8. The apparatus according to claim 1, wherein said hollow enclosure is substantially oval.

9. The apparatus according to claim 1, wherein each of said pair of acoustic inlet openings is oriented substantially coplanar with respect to one another.

10. The apparatus according to claim 1, wherein each of said pair of acoustic exit openings is oriented substantially coplanar with respect to one another.

11. The apparatus according to claim 1, wherein said pair of acoustic inlet openings and said pair of acoustic exit openings are oriented substantially parallel to one another.

12. The apparatus according to claim 1, wherein said pair of acoustic inlet openings and said pair of acoustic exit openings are oriented in a plane that is substantially perpendicular to the path of acoustic waves produced by the acoustic source.

13. The apparatus according to claim 1, wherein said pair of acoustic inlet openings and said pair of acoustic exit openings are oriented in a plane that is substantially parallel to the path of acoustic waves produced by the acoustic source.

14. The apparatus according to claim 1, wherein said pair of acoustic inlet openings and said pair of acoustic exit openings are substantially semi-circular in shape.

15. The apparatus according to claim 1, wherein said pair of acoustic inlet openings and said pair of acoustic exit openings are substantially circular in shape.

16. The apparatus according to claim 1, wherein said pair of acoustic paths is in the shape of a double helix.

17. The apparatus according to claim 16, wherein the radius of each of said pair of acoustic paths is substantially equal to the radius of said hollow enclosure.

18. The apparatus according to claim 1, wherein said pair of acoustic exit openings further comprises webbing that prevents the admission of debris into said pair of acoustic paths.

19. The apparatus according to claim 18, wherein said webbing is made from material selected from the group consisting of foam, wire, woven textile material, and non-woven textile material.

20. An apparatus for increasing the quality of sound from an acoustic source by improving the range of bass sounds produced by the acoustic source, said apparatus comprising:

a hollow enclosure having a first open end, a second open end, an interior surface, and an exterior surface;

an acoustic source connected to said first open end of said hollow enclosure, an acoustic guide having a first end and a second end, said acoustic guide mounted to the interior surface of said hollow enclosure and spaced apart longitudinally from said acoustic source, said acoustic guide in the shape of a double helix; and a pair of acoustic paths defined by said acoustic guide, said pair of acoustic paths in the shape of a double helix;

wherein each one of said acoustic paths is mutually exclusive of the other and promote unidirectional travel flow of the acoustic waves;

wherein said acoustic guide separates acoustic waves from said acoustic source and directs the acoustic waves along said pair of acoustic paths.

21. The apparatus according to claim 20, wherein said hollow enclosure is substantially circular.

22. The apparatus according to claim 20, wherein said hollow enclosure is a substantially oval.

23. The apparatus according to claim 20, wherein said hollow enclosure substantially surrounds said acoustic guide.

24. The apparatus according to claim 20, wherein said hollow enclosure and said acoustic guide define a common axis.

25. The apparatus according to claim 20, wherein said acoustic source is a driver.

26. The apparatus according to claim 20, wherein said acoustic guide is made from material selected from the group consisting of polymeric material, metal, wood, synthetic resin, glass, and ceramic.

27. The apparatus according to claim 20, wherein the pitch of said acoustic guide is between about 0.15 and 10 centimeters.

28. The apparatus according to claim 20, wherein the pitch of said acoustic guide is between about 2 and 5 centimeters.

29. The apparatus according to claim 20, wherein said acoustic guide is mounted to the interior surface of said hollow enclosure with material selected from the group consisting of adhesive, foam rubber, and hook-and-loop fasteners.

30. The apparatus according to claim 20, wherein:

said hollow enclosure includes grooves formed in the interior surface of said hollow enclosure;

said grooves in a corresponding relationship with edges of said acoustic guide;

said acoustic guide mounted in said grooves in the interior surface of said hollow enclosure.

31. The apparatus according to claim 20, wherein said first end of said acoustic guide is connected to said acoustic source.

32. The apparatus according to claim 20, further comprising an empty chamber defined by the interior surface of said hollow enclosure, said first end of said hollow enclosure, and said first end of said acoustic guide.

33. The apparatus according to claim 20, wherein the radius of each of said pair of acoustic paths is substantially equal to the radius of said hollow enclosure.

34. The apparatus according to claim 20, further comprising at least one leg secured to the exterior surface of said hollow enclosure.

35. The apparatus according to claim 20, further comprising:

a pair of acoustic inlet openings defined by said first end of said acoustic device;

a pair of acoustic exit openings defined by said second end of said acoustic device, said pair of acoustic exit openings in communication with said pair of acoustic paths and said pair of acoustic inlet openings.

36. The apparatus according to claim 35, wherein each of said pair of acoustic inlet openings is oriented substantially coplanar with respect to one another.

37. The apparatus according to claim 35, wherein each of said pair of acoustic inlet openings is oriented substantially coplanar with respect to said first end of said hollow enclosure.

38. The apparatus according to claim 35, wherein each of said pair of acoustic exit openings is oriented substantially coplanar with respect to one another.

39. The apparatus according to claim 35, wherein each of said pair of acoustic exit openings is oriented substantially coplanar with respect to said second end of said hollow enclosure.

40. The apparatus according to claim 35, wherein said pair of acoustic inlet openings and said pair of acoustic exit openings are oriented substantially parallel to one another.

41. The apparatus according to claim 35, wherein said pair of acoustic inlet openings and said pair of acoustic exit openings are oriented in a plane that is substantially perpendicular to the path of the acoustic waves produced by said acoustic source.

42. The apparatus according to claim 35, wherein said pair of acoustic inlet openings and said pair of acoustic exit openings are oriented in a plane that is substantially parallel to the path of acoustic waves produced by said acoustic source.

43. The apparatus according to claim 35, wherein said pair of acoustic inlet openings and said pair of acoustic exit openings are substantially semi-circular in shape.

44. The apparatus according to claim 35, wherein said pair of acoustic inlet openings and said pair of acoustic exit openings are substantially circular in shape.

45. The apparatus according to claim 35, wherein said pair of acoustic exit openings further comprises webbing that prevents the admission of debris into said pair of acoustic paths.

46. The apparatus according to claim 45, wherein said webbing is made from material selected from the group consisting of foam, wire, woven textile materials, and non-woven textile material.

* * * * *